United States Patent
Brown et al.

(10) Patent No.: US 7,149,105 B2
(45) Date of Patent: Dec. 12, 2006

(54) MAGNETIC TUNNEL JUNCTIONS FOR MRAM DEVICES

(75) Inventors: Stephen L. Brown, Carmel, NY (US); Arunava Gupta, Tuscaloosa, AL (US); Ulrich Klostermann, Fontainebleau (FR); Stuart Stephen Papworth Parkin, San Jose, CA (US); Wolfgang Raberg, Fontainebleau (FR); Mahesh Samant, San Jose, CA (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 218 days.

(21) Appl. No.: 10/785,913

(22) Filed: Feb. 24, 2004

(65) Prior Publication Data
US 2005/0185454 A1   Aug. 25, 2005

(51) Int. Cl.
G11C 11/00 (2006.01)
H01L 29/76 (2006.01)
H01L 29/94 (2006.01)
H01L 31/062 (2006.01)
H01L 31/113 (2006.01)

(52) U.S. Cl. .............................. 365/158; 257/295
(58) Field of Classification Search ............... 257/295; 365/158
See application file for complete search history.

(56) References Cited

U.S. PATENT DOCUMENTS

| 5,650,958 | A | 7/1997 | Gallagher et al. |
| 5,841,692 | A | 11/1998 | Gallagher et al. |
| 6,181,537 | B1 | 1/2001 | Gill |
| 6,452,240 | B1 | 9/2002 | Ingvarsson et al. |
| 6,518,588 | B1 | 2/2003 | Parkin et al. |
| 6,707,084 | B1 * | 3/2004 | Katti et al. ................ 257/295 |
| 6,842,317 | B1 * | 1/2005 | Sugita et al. ............ 360/324.2 |
| 2003/0072109 | A1 | 4/2003 | Sharma et al. |

OTHER PUBLICATIONS

Bailey, W., et al., "Control of Magnetization Dynamics in $Ni_{81}Fe_{19}$ Thin Films Through the Use of Rare-Earth Dopants," IEEE, Jul. 2001, pp. 1749-1754, vol. 37.
Worledge, D.C., et al., "Magnetoresistance Measurement of Unpatterned Magnetic Tunnel Junction Wafers by Current-in-Plane Tunneling," Applied Physics Letters, Jul. 7, 2003, pp. 84-86, vol. 83, No. 1, MRAM Development Alliance, IBM/Infineon Technologies, Yorktown Heights, NY.

* cited by examiner

*Primary Examiner*—Howard Weiss
(74) *Attorney, Agent, or Firm*—Slater & Matsil, L.L.P.

(57) ABSTRACT

Methods of manufacturing MTJ memory cells and structures thereof. A diffusion barrier is disposed between an antiferromagnetic layer and a pinned layer of an MTJ memory cell to improve thermal stability of the MTJ memory cell. The diffusion barrier may comprise an amorphous material or a NiFe alloy. An amorphous material may be disposed adjacent a bottom surface of a tunnel junction, within a free layer, or both. An MTJ memory cell with improved thermal stability and decreased Neel coupling is achieved.

74 Claims, 5 Drawing Sheets

MAGNETIC TUNNEL JUNCTIONS FOR MRAM DEVICES

TECHNICAL FIELD

The present invention relates generally to semiconductor memory devices, and more particularly to magnetic tunnel junctions (MTJ's) used as storage elements in magnetic random access memory (MRAM) devices and methods of manufacture thereof.

BACKGROUND

Semiconductors are used in integrated circuits for electronic applications, including radios, televisions, cell phones, and personal computing devices, as examples. One type of semiconductor device is a semiconductor storage device, such as a dynamic random access memory (DRAM) or a flash memory, both of which use charge to store information.

A more recent development in semiconductor memory devices involves spin electronics, which combines semiconductor technology and magnetic materials and devices. The spins of electrons, through their magnetic moments, rather than the charge of the electrons, is used to indicate the presence of a "1" or "0". One such spin electronic device is a magnetic random access memory (MRAM) device 100, as shown in FIG. 1, which includes conductive lines (wordlines WL and bitlines BL) positioned in a different direction, e.g., perpendicular to one another in different metal layers, the conductive lines sandwiching a magnetic stack or magnetic tunnel junction (MTJ) 102, which functions as a magnetic memory cell. FIG. 1 shows a perspective view of a portion of a prior art cross-point MRAM array 100. The MRAM device 100 includes a semiconductor wafer comprising a workpiece (not shown). The workpiece has a first insulating layer (also not shown) deposited thereon, and a plurality of first conductive lines or wordlines WL is formed within the first insulating layer, e.g., in a first wiring level. The wordlines WL may comprise copper, aluminum, combinations thereof, and/or other metals, for example.

In a cross-point magnetic memory device 100, each memory cell or magnetic tunnel junction (MTJ) 102 is disposed over and abuts one wordline WL, as shown. The MTJ 102 of a magnetoresistive memory comprises three layers: ML1, TL and ML2. The MTJ 102 includes a first magnetic layer ML1 disposed over and abutting the wordline WL. The first magnetic layer ML1 is often referred to as a fixed layer because its magnetic orientation is fixed. A tunnel layer or tunnel barrier layer TL comprising a thin dielectric layer is formed over the fixed layer ML1. A second magnetic layer ML2 is formed over the tunnel barrier layer TL. The second magnetic layer ML2 is often referred to as a free layer because its magnetic orientation can be switched along one of two directions depending on the logic state of the memory cell. The first and second magnetic layers ML1 and ML2 may comprise one or more material layers, for example.

Each MTJ 102 has a second conductive line or bitline BL disposed over and abutting the second magnetic layer ML2, as shown in FIG. 1, wherein the bitline BL is positioned in a direction different from the direction of the wordline WL, e.g., the bitlines BL may be orthogonal to the wordlines WL. An array 100 of magnetic memory cells 102 comprises a plurality of wordlines WL running parallel to one another in a first direction, a plurality of bitlines BL running parallel to one another in a second direction, the second direction being different from the first direction, and a plurality of MTJ's 102 disposed between each wordline WL and bitline BL. While the bitlines BL are shown on top and the wordlines WL are shown on bottom of the array 100, alternatively, the wordlines WL may be disposed on the top of the array and the bitlines BL may be disposed on the bottom of the array, for example.

Either one of the first or second magnetic layers ML1 and ML2 may comprise a hard magnetic material (and is the fixed layer), and the other comprises a soft magnetic material (and is the free layer), although in the discussion herein, the first magnetic layer ML1 comprises the hard magnetic material, and the second magnetic layer ML2 comprises the soft magnetic material. The value of the resistance of the cell or MTJ 102 depends on the way in which the magnetic moment of the soft magnetic layer ML2 is oriented in relation to the magnetic moment of the hard magnetic layer ML1. The resistance of the magnetic memory cell 102 depends on the moment's relative alignment. The resistance Rc is usually lower if the magnetic layers have parallel magnetic orientations. For example, if the first and second magnetic layers ML1 and ML2 are oriented in the same direction, as shown in FIG. 2B, the cell resistance Rc is low. If the first and second magnetic layers ML1 and ML2 are oriented in opposite directions, shown in FIG. 2C, the cell resistance Rc is high. These two states of the cell are used to store digital information (a logic "1" or "0", high or low resistance, or vice versa).

The hard magnetic layer ML1 is usually oriented once during manufacturing. The information of the cell 102 is stored in the soft magnetic layer ML2. As shown in FIG. 2A, the currents $I_{WL}$ and $I_{BL}$ through the wordline WL and bitline BL, respectively, provide the magnetic field that is necessary to store information in the soft magnetic layer ML2. The superimposed magnetic fields of the bitline BL and wordline WL currents have the ability to switch the magnetic moment of the soft magnetic layer ML2 and change the memory state of the cell 102.

An advantage of MRAM devices compared to traditional semiconductor memory devices such as dynamic random access memory (DRAM) devices is that MRAM devices are non-volatile. For example, a personal computer (PC) utilizing MRAM devices would not have a long "boot-up" time as with conventional PCs that utilize DRAM devices. Also, an MRAM device does not need to be powered up and has the capability of "remembering" the stored data (also referred to as a non-volatile memory). MRAM devices have the capability to provide the density of DRAM devices and the speed of static random access memory (SRAM) devices, in addition to non-volatility. Therefore, MRAM devices have the potential to replace flash memory, DRAM and SRAM devices in electronic applications where memory devices are needed in the future.

Because MRAM devices operate differently than traditional memory devices, they introduce design and manufacturing challenges. For example, the materials and processing techniques for manufacturing magnetic tunnel junction (MTJ) memory cells must be compatible with conventional complementary metal oxide semiconductor (CMOS) processing, because the MTJ memory cells are built over substrates comprising CMOS circuits that are used to read and write the state of the MTJ memory cells. Manganese (Mn) may be used in one of the layers of the bottom magnetic layer ML1, for example, for an anti-ferromagnetic layer, which is used to exchange bias the corresponding ferromagnetic reference layer for the purposes of fixing its magnetic moment in a particular direction set by the exchange bias field, as described in U.S. Pat. No. 5,650,958 entitled "Magnetic Tunnel Junctions With Controlled Magnetic Response," issued on Jul. 22, 1997 to Gallagher et al., and U.S. Pat. No. 5,841,692, entitled, "Magnetic Tunnel Junction Device With Antiferromagnetically Coupled Pinned Layer", issued on Nov. 24, 1998 to Gallagher et al., which are incorporated herein by reference. When heated to temperatures above about 350 degrees C., or lower or higher than 350 degrees C., depending on the composition of the manganese containing layer, manganese can diffuse into other layers of an MTJ memory cell, causing deterioration of various parts of the MTJ memory cell. For example, it is possible that the magnetic reference system may be weakened or, more likely, the Mn diffuses to or even through the tunnel barrier which can result in diminished magnetoresistance and/or lowered resistance, effectively destroying the functioning of the MTJ memory cell.

Another problem confronted in MRAM manufacturing is Neel coupling between nearby magnetic material layers. Neel coupling is ferromagnetic coupling or a magnetic interaction resulting from layers which have rough surfaces, whereby magnetic dipole fields arising from the first surface of one ferromagnetic layer interact with the second surface for a neighboring ferromagnetic layer. This coupling is also referred to as orange peel coupling in the art. Neel coupling results in a resistive memory element that is magnetically asymmetrical and therefore, favors one state of the memory over the other state, making the memory device difficult to operate. When large Neel coupling is present, the MTJ memory cell may require larger fields to switch or change its state.

What is needed in the art is an MTJ design that has a high degree of thermal stability, with reduced Neel coupling.

SUMMARY OF THE INVENTION

These and other problems are generally solved or circumvented, and technical advantages are generally achieved, by preferred embodiments of the present invention, which provide methods of manufacturing improved MTJ memory cells and structures thereof. The MTJ cell is comprised of a first and a second magnetic layer disposed on either side of a tunnel barrier layer. In one embodiment, a diffusion barrier formed from one or more thin layers of an amorphous ferromagnetic material are inserted within or at the surfaces of the first and second magnetic layers of an MTJ memory cell, resulting in improved performance of the MTJ cell particularly with regard to an increased thermal stability. In another embodiment, a diffusion barrier is disposed between an anti-ferromagnetic layer and an anti-parallel layer of a first magnetic layer of an MTJ memory cell. The diffusion barrier is comprised of an amorphous ferromagnetic material or may also be comprised of a nickel-iron (NiFe) alloy such as permalloy. A pinned layer of the anti-parallel layer may comprise a NiFe alloy diffusion barrier, in one embodiment. An amorphous material layer may be disposed within the second magnetic layer, or between the tunnel barrier layer and the first magnetic layer, or both, resulting in improved thermal stability and reduced Neel coupling for an MTJ memory cell.

In accordance with a preferred embodiment of the present invention, an MTJ memory cell includes an anti-ferromagnetic layer, a diffusion barrier layer disposed over the anti-ferromagnetic layer, and an anti-parallel magnetic layer disposed over the diffusion barrier. The anti-parallel magnetic layer includes a pinned layer disposed over the diffusion barrier, a spacer disposed over the pinned layer, and a reference layer disposed over the spacer. A tunnel barrier layer is disposed over the anti-parallel magnetic layer, and a free magnetic layer disposed over the tunnel barrier layer.

In accordance with another preferred embodiment of the present invention, an MTJ memory cell includes an anti-ferromagnetic layer, an anti-parallel magnetic layer disposed over the anti-ferromagnetic layer, a tunnel barrier layer disposed over the anti-parallel magnetic layer, and a free magnetic layer disposed over the tunnel barrier layer. The free magnetic layer includes a first amorphous ferromagnetic layer disposed within and spaced apart from the tunnel barrier layer.

In accordance with another preferred embodiment of the present invention, a method of manufacturing an MTJ memory cell includes providing a workpiece, forming an anti-ferromagnetic layer over the workpiece, forming a diffusion barrier layer over the anti-ferromagnetic layer, and forming an anti-parallel magnetic layer over the diffusion barrier. Forming the anti-parallel magnetic layer includes forming a pinned layer over the diffusion barrier, forming a spacer over the pinned layer, and forming a reference layer over the spacer. A tunnel barrier layer is formed over the anti-parallel magnetic layer, and a free magnetic layer is formed over the tunnel barrier layer.

In accordance with yet another preferred embodiment of the present invention, a method of manufacturing an MTJ memory cell includes providing a workpiece, forming an anti-ferromagnetic layer over the workpiece, forming an anti-parallel magnetic layer over the anti-ferromagnetic layer, forming a tunnel barrier layer over the anti-parallel magnetic layer, and forming a free magnetic layer over the tunnel barrier layer. Forming the free magnetic layer includes forming a first amorphous ferromagnetic layer within and spaced apart from the tunnel barrier layer.

Advantages of embodiments of the present invention include reducing or eliminating Neel coupling and improving thermal stability of MTJ memory cells, which results in improved device yields and cost savings.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely magnetic memory cells of an MRAM device. Embodiments of the present invention may also be applied, however, to other magnetic memory cell designs and magnetic semiconductor device applications, as well as magnetic hard disk drive recording read heads and sensors.

Figure 3:
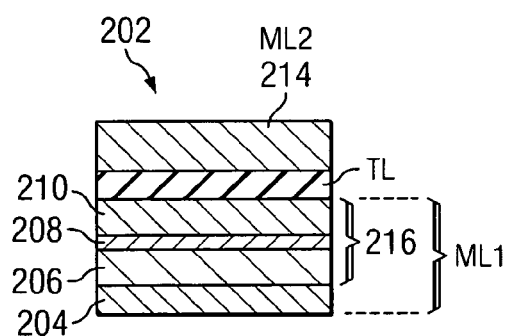
FIG. 3 shows a cross-sectional view of a less preferred embodiment of an MTJ memory cell.

FIG. 3 shows a cross-sectional view of a less-preferred design of an MTJ memory cell 202. The MTJ memory cell 202 comprises a first magnetic layer ML1, a tunnel barrier layer (TL) disposed over the first magnetic layer ML1, and a second magnetic layer ML2 disposed over the tunnel barrier layer TL, as shown. The first magnetic layer ML1 comprises an anti-ferromagnetic (AF) layer 204 which may be coupled to an underlying bitline, not shown. The first magnetic layer ML1 comprises an anti-parallel (AP) layer 216 disposed over the anti-ferromagnetic layer 204, as shown.

The anti-parallel layer 216 comprises a pinned layer 206 disposed over and adjacent the anti-ferromagnetic layer 204. The anti-ferromagnetic layer 204 pins the magnetic orientation of the pinned layer 206. The pinned layer 206 comprises a ferromagnetic material. The anti-parallel layer 216 includes a spacer layer 208 comprising a thin layer of non-magnetic material such as ruthenium (Ru) disposed over the pinned layer 206. The anti-parallel layer 216 includes a reference layer 210 comprising a ferromagnetic material disposed over the spacer layer 208. The spacer layer 208 causes the reference layer 210 to couple anti-ferromagnetically, aligning the ferromagnetic moment of the reference layer 210 and the first magnetic layer ML1 in a particular direction. The Ru spacer layer 208 mediates the coupling of the pinned layer 206 and the reference layer 210.

The spacer layer 208 is advantageous because when the MTJ 202 material stack is patterned, the magnetostatic fringing field from the first magnetic layer ML1 is reduced compared to a first magnetic layer formed from a single ferromagnetic layer, as described in U.S. Pat. No. 5,841,692. This fringing field influences the magnetic switching characteristics of the free layer or the second magnetic layer ML2 on the opposite side of the tunnel barrier layer TL, which typically comprises $Al_2O_3$. An MTJ 202 having an anti-parallel layer 216 is advantageous because the magnetic moments of the pinned layer 206 and the pinned layer 210 may be compensated so that there is no magnetic field acting on the free layer ML2, or can be used to compensate for any Neel field which might be present; therefore, the free layer ML2 has no preference for its magnetic orientation along one direction or the opposite direction and may be switched from one memory state to another with the same magnitude of magnetic field.

A problem with the MTJ memory cell 202 shown in FIG. 3 is that an anti-parallel reference layer 216 has poor thermal stability, making the MTJ memory cell 202 incompatible for use in CMOS processing. The magnetoresistance of magnetic tunnel junctions (MTJ) deteriorates upon thermal annealing. When the MTJ memory cell 202 is heated during subsequent processing steps used to manufacture an MRAM array, for example, the performance of the MTJ memory cell 202 may be adversely affected by outdiffusion of materials of the anti-ferromagnetic layer 204 into overlying material layers of the MTJ memory cell 202.

One of the most important causes of thermal instability of MTJ memory cells 202 is the diffusion and subsequent accumulation of Mn at the tunnel barrier—ferromagnet (FM) interface, or in case of an anti-parallel (AP)-pinned type structure, at the AP-coupling spacer 208. The source of the Mn is the antiferromagnet (AF) used to magnetically harden one of the FM layers by exchange biasing. Many useful antiferromagnetic materials, namely those with high blocking temperatures and large exchange bias energies, are formed from alloys of Mn with another element or elements. For example, the anti-ferromagnetic layer 204 may comprise PtMn, or alternatively may comprise IrMn, FeMn, CrPtMn or other manganese-containing materials. When heated to about 320° C. or above for a period of time, which is typically required by CMOS manufacturing processes, Mn diffusion can be induced from the anti-ferromagnetic layer 204 to the spacer layer 208 of the anti-parallel layer 216, effectively changing the thickness of the Ru spacer layer 208 or weakening the AP coupling provided by the layer 208, and destroying the mediation by the Ru spacer layer 208 of the coupling of the pinned layer 206 and the reference layer 210. The Mn can also diffuse to the tunnel barrier layer TL. The Mn diffusion may cause the first magnetic layer ML1 to lose its fixed orientation. Thus, the Mn diffusion may destroy or weaken the coupling across the anti-parallel spacer 208, causing a deterioration of magnetic properties of the MTJ memory cell 202, an inability to store information in the MTJ memory cell 202, and a failure of the MTJ memory cell 202.

Figure 4:
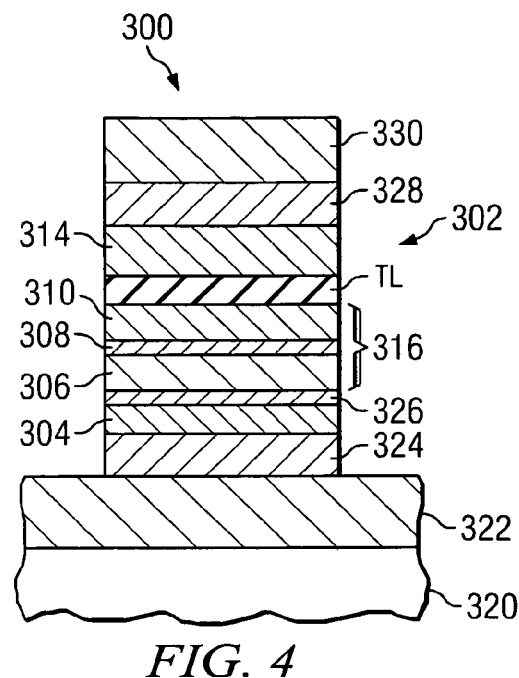
FIG. 4 shows a cross-sectional view of an MTJ memory cell in accordance with an embodiment of the present invention, wherein a diffusion barrier layer is disposed over an anti-ferromagnetic (AF) layer of the MTJ memory cell.

Embodiments of the present invention achieve technical advantages by improving thermal stability of MTJ memory cells. FIG. 4 shows a cross-sectional view of an MTJ memory cell 302 of an MRAM device 300 in accordance with an embodiment of the present invention, wherein a diffusion barrier layer 326 is disposed over an anti-ferromagnetic (AF) layer 304 of the MTJ memory cell 302 to prevent diffusion of Mn into overlying material layers.

A process flow for fabricating the MTJ memory cell 302 will next be described. A workpiece 320 is provided. The workpiece 320 may include a semiconductor substrate comprising silicon or other semiconductor materials covered by an insulating layer, for example. The workpiece 320 may also include other active components or circuits formed in a CMOS front end of line (FEOL) fabrication process, not shown. The workpiece 320 may comprise silicon oxide over single-crystal silicon, for example. The workpiece 320 may include other conductive layers or other semiconductor elements, e.g. transistors, diodes, etc. Compound semiconductors, GaAs, InP, Si—Ge, or SiC, as examples, may be used in place of silicon.

A first conductive line 322 is formed over a workpiece 320. The first conductive line 322 may be formed by a subtractive method; e.g., a conductive material is deposited over the workpiece 320, and the conductive material is patterned using lithography to form the first conductive line 322. The first conductive line 322 may comprise a wordline of a cross-point MRAM array comprising a plurality of wordlines, for example. An insulating material may be deposited between the plurality of first conductive lines 322, not shown. The first conductive line 322 may also be formed using damascene methods, e.g., by depositing an insulating material, patterning the insulating material with trenches, and then depositing a conductive material within the trenches.

A plurality of material layers 324, 304, 326, 316, TL, 314, 328, 330 for an MTJ stack are deposited over the first conductive line 322, and the entire MTJ stack is patterned, preferably in a single lithography step, forming a MTJ memory cell 302. The material layers 324, 304, 326, 316, TL, 314, 328, 330 may be deposited sequentially using magnetron sputtering in $3 \times 10^{-3}$ torr of Argon, for example. The material layers 324, 304, 326, 316, TL, 314, 328, 330 may alternatively be deposited by ion beam deposition or a combination of magnetron sputtering and ion beam deposition, as examples.

In accordance with a preferred embodiment of the present invention, first, a base layer 324 is disposed over the first conductive lines 322. The base layer 324 preferably comprises about 50 Å of TaN. The base layer 324 may alternatively comprise a bilayer of about 50 Å of TaN, and about 10 to 50 Å of Ta disposed over the TaN layer, as described in U.S. Pat. No. 6,518,588 entitled "Magnetic Random Access Memory with Thermally Stable Magnetic Tunnel Junction Cells," issued on Feb. 11, 2003 to Parkin, et al., which is incorporated herein by reference. The base layer 324 may alternatively comprise other materials and dimensions, for example. The base layer 324 may function as a seed layer for the anti-ferromagnetic layer 304 and other materials that will later be formed over the base layer 324, for example.

An anti-ferromagnetic layer 304 is formed over the base layer 324. The anti-ferromagnetic layer 304 may comprise about 80 to 300 Å of PtMn, for example. The anti-ferromagnetic layer 304 may alternatively comprise other dimensions and other anti-ferromagnetic materials such as IrMn, FeMn, CrPtMn, or other manganese-containing materials, as examples.

In accordance with an embodiment of the invention, a diffusion barrier 326 is disposed over the anti-ferromagnetic layer 304, as shown. The diffusion barrier 326 or buffer layer preferably comprises an amorphous ferromagnetic material, in one embodiment. The general properties of such an amorphous ferromagnetic layer preferably are that it is electrically conducting, and ferromagnetic with a Curie temperature or magnetic ordering temperature well above the operating temperature of the device 300. The diffusion barrier 326 layer is preferably sufficiently electrically conducting so that current can be passed through this layer 326 for the purposes of reading the MTJ memory cell 302. Thus, the resistance of the diffusion barrier 326 layer, for current passed perpendicularly to this layer, is preferably significantly less than the resistance of the tunnel barrier layer TL at the operating voltage of the MTJ memory cell 302: otherwise, the reading signal will be significantly reduced.

Regarding the amorphous nature of the diffusion barrier 326, for the purposes of embodiments of the present invention, the diffusion barrier 326 layer is defined as amorphous if it lacks any obvious crystalline granular structure, for example, as would be found by studying the structure of the diffusion barrier 326 layer using cross-sectional transmission electron microscopy. Generally, the amorphous ferromagnetic layer 326 is preferably formed from alloys of predominantly one or more of the 3d transition metal ferromagnets, such as Fe, Co and Ni, with smaller amounts of glass-forming elements such as boron, silicon or phosphorous, and early 4d or 5d transition metals such as Zr, Nb and Hf, as examples.

For example, the diffusion barrier 326 may comprise an amorphous CoFe based alloy, such as CoFe doped with B. The composition of this layer may be, for example, about 75 atomic % CoFe and about 25 atomic % B, wherein the CoFe alloy comprises about 70 atomic % Co and about 30 atomic % Fe, respectively. For CoFeB alloys, the B content may be in the range of about 10 to 30 atomic percent to obtain a material which is both amorphous and ferromagnetic, for example. The diffusion barrier 326 may also comprise other CoFe based materials, such as CoFeMoSiB, as an example.

The diffusion barrier 326 may comprise an amorphous ferromagnet, such as: amorphous alloys of 3d transition magnetic elements (T=Fe, Co, or Ni) formed with a metalloid (M=B, P, Si), such as $T_{1-x}M_x$ with about 15<x<about 30%, e.g., $Fe_{80}B_{20}$, $Fe_{40}Ni_{40}PP_{14}B_6$, $CO_{74}Fe_5B_{18}Si_3$, etc.; amorphous alloys of 3d transition magnetic elements (T=Fe, Co, or Ni) formed with early transition metals of 4d or 5d type (ET=Zr, Nb, Hf), such as $T_{1-x}ET_x$, with about 5<x<about 15%, e.g., $CO_{90}Zr_{10}$, $Fe_{84}Nb_{12}B_4$, $CO_{82}Nb_{14}B_4$, etc.; or amorphous alloys of 3d transition magnetic elements (T=Fe, Co, or Ni) formed with rare earth materials (R) and metalloids (M), such as $T_xM_yR_{1-x-y}$, with about 75<x<90% and 0<y<10%, e.g., $Co_{80}Gd_{20}$, $Fe_{75}Tb_{25}$, etc., although alternatively, the diffusion barrier 326 may comprise other materials. Amorphous materials function as diffusion barriers because the lack of crystallinity results in an absence of grain boundaries. Higher atomic diffusion is often found along grain boundaries than in the bulk of crystalline layers.

Alternatively, in another embodiment of the present invention, the diffusion barrier 326 preferably comprises a NiFe alloy such as permalloy, which also may function as a diffusion barrier and/or is less susceptible to Mn interdiffusion. In this embodiment, the NiFe alloy of the diffusion barrier 326 preferably comprises a face centered cubic crystalline structure. The NiFe alloy preferably comprises about 60 to 90 atomic % Ni and about 10 to 40 atomic % Fe, and more preferably comprises about 75 to 85 atomic % Ni and about 15 to 25 atomic % Fe, as examples. In one embodiment, the diffusion barrier 326 comprises an alloy containing about 80 atomic % Ni and about 20 atomic % Fe, for example.

The diffusion barrier 326 preferably comprises a thickness of about 20 Å or less, and more preferably, comprises a thickness of about 5 Å, although alternatively, the diffusion barrier 326 may comprise other dimensions, as examples. The diffusion barrier 326 prevents any underlying materials such as Mn in the anti-ferromagnetic layer 304 from diffusing into the material layers 306, 308 or 310 over the diffusion barrier 326 at high temperatures, improving the thermal stability of the MTJ memory cell 302.

An anti-parallel layer 316 is formed over the diffusion barrier 326, as shown. The anti-parallel layer 316 may comprise CoFe/Ru/CoFe, CoFe/Ru/NiFe or combinations thereof, as examples. More particularly, the anti-parallel layer 316 preferably comprises a pinned layer 306 disposed over and adjacent the anti-ferromagnetic layer 304. The pinned layer 306 comprises about 20 Å of a ferromagnetic material such as CoFe, although alternatively, the pinned layer 306 may comprise a CoFe alloy or NiCoFe, as examples. In one embodiment, the pinned layer 306 may comprise a NiFe alloy, such as permalloy. The anti-parallel layer 316 includes a spacer layer 308 comprising a thin layer of non-magnetic material such as Ru disposed over the pinned layer 306. The spacer layer 308 may comprise a thickness of about 4 to 11 Å or less, for example, and in one embodiment, comprises about 15 Å or less. The anti-parallel layer 316 includes a reference layer 310 comprising a ferromagnetic material disposed over the spacer layer 308. The reference layer 310 may comprise about 20 Å of a ferromagnetic material such as CoFe, although alternatively, the reference layer 310 may comprise NiFe or NiFeCo, as examples. The pinned layer 306 sets the magnetic orientation of the reference layer 310. The anti-parallel layer 316 is also referred to herein as a reference system.

In one embodiment, a diffusion barrier 326 is not used, and the pinned layer 306 comprises a NiFe alloy such as permalloy. In this embodiment, the pinned layer 306 functions as a pinned layer of the anti-parallel layer 316 and also as a diffusion barrier. In another embodiment, a diffusion barrier 326 is also not used, and the pinned layer 306 comprises an amorphous ferromagnetic material, such as the materials described for the diffusion barrier 326, above. In this embodiment, the pinned layer functions as a pinned layer of the anti-parallel layer 316 and also as a diffusion barrier.

A tunnel barrier layer TL is formed over the anti-parallel layer 316. The tunnel barrier layer TL preferably comprises about 10 to 20 Å of $Al_2O_3$ in one embodiment, although the tunnel barrier layer TL may alternatively comprise other insulators and dimensions, for example. The tunnel barrier layer TL may be formed by depositing a thin Al layer and oxidizing the thin Al layer, in one or more processing steps. For example, the tunnel barrier layer TL may be formed by oxidizing the thin Al layer with an oxygen plasma for about 30 to 240 seconds in the presence of about 0.1 torr of oxygen, or may be oxidized in molecular or atomic oxygen. The oxidation time and conditions are varied according to the thickness of the aluminum layer.

A free layer 314 is formed over the tunnel barrier layer TL. The free layer preferably comprises a soft magnetic material. The free layer 314 may comprise, as examples, NiFe, CoFe, CoFe based alloys, CoFeB, or other amorphous ferromagnetic alloy materials, as examples. The free layer 314 may comprise a thickness of about 15 to 100 Å, as examples, although the free layer 314 may alternatively comprise other dimensions. The free layer 314 may comprise a single layer, a bilayer such as CoFe/CoFeB or CoFe/NiFe or CoFe/NiFeB, or the free layer 314 may comprise an anti-parallel layer comprising two ferromagnetic materials separated and coupled by a non-magnetic spacer such as Ru, as described for the anti-parallel layer 316, for example. In one embodiment, the free layer 314 comprises an anti-parallel layer comprising CoFe/Ru/CoFe. In another embodiment, the free layer 314 may comprise about 20 to 40 Å of CoFeB disposed on either side of a Ru spacer comprising a thickness of about 3 to 30 Å, for example. The Ru layer of the free layer 314 may be of a different thickness than the Ru spacer of the anti-parallel layer 316, for example.

Referring again to FIG. 4, a cap layer 328 is formed over the free layer 314. The cap layer 328 preferably comprises TaN, although the cap layer 328 may alternatively comprise other inert materials such as Ta, Ru or thin layers of $Al_2O_3$, as examples. The cap layer 328 preferably comprises a thickness of about 50 to 100 Å, although alternatively, the cap layer 328 may comprise other dimensions. The cap layer 328 may be formed by reactive sputtering of Ta in an $Ar^+ N_2$ gas mixture, as an example. The total thickness of the layers 324, 304, 326, 316, TL, 314, 328 comprising the MTJ memory cell 302 may comprise about 300 to 500 Å, for example.

The diffusion barrier 326 provides thermal stability for the MTJ memory cell 302 by preventing diffusion of materials such as Mn of the anti-ferromagnetic layer 304 into the anti-parallel layer 316. Disposing a diffusion barrier 326 in an anti-parallel reference tunnel magnetoresistance (TMR) stack such as anti-parallel layer 316 of MTJ memory cell 302 significantly improves the magnetic and electrical performance of the MTJ memory cell 302, particularly at higher temperatures, e.g., at about 350° C. or higher, thus enabling CMOS process compatibility for the MTJ memory cell 302.

When the diffusion barrier 326 comprises an amorphous material, the diffusion barrier 326 also reduces Neel coupling by providing a smooth surface, which enhances the tunnel barrier layer TL performance. The smooth diffusion barrier 326 causes a smoother surface for the anti-parallel layer 316 and also the tunnel barrier layer TL. The enhanced smoothness of the tunnel barrier layer allows the formation of thinner, smoother, and more repeatable tunnel barrier layers (from a manufacturing standpoint), thus improving the magnetoresistive (MR) and resistance-area (RA) characteristics of the MTJ memory cell 302, to be described further herein with reference to Tables 1 and 2. Smoother layers also enhance the thermal stability of the magnetic tunnel junction memory cell.

Figure 6:
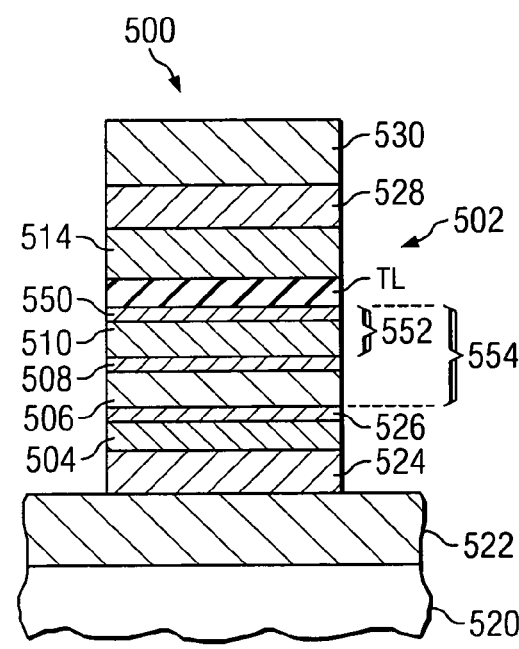
FIG. 6 shows a cross-sectional view of an MTJ memory cell in accordance with yet another embodiment of the present invention, wherein an amorphous FM layer is disposed adjacent a bottom surface of a tunnel junction.
Figure 7A:
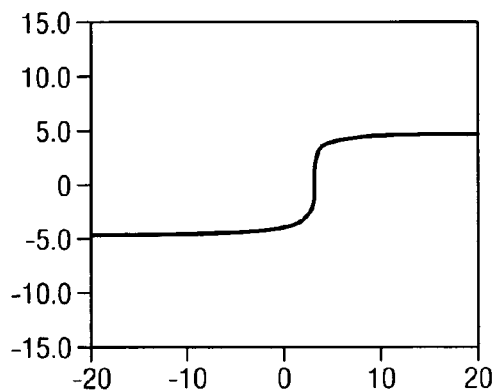
FIG. 7A–7D through 10A–10D show experimental results comparing the performance of various material layers to an embodiment of the present invention where NiFe is used as a pinned layer of an anti-parallel layer.
Figure 7B:
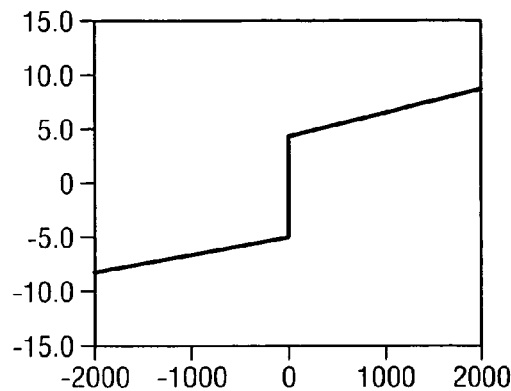
Figure 7C:
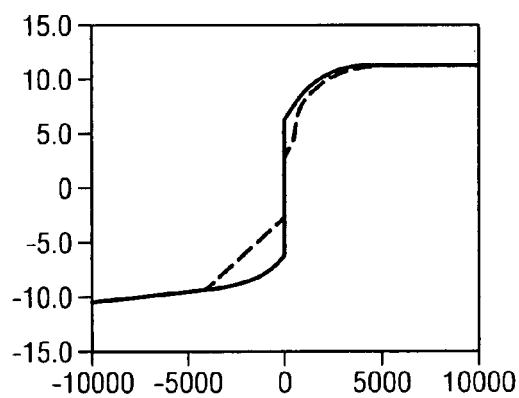
Figure 7D:
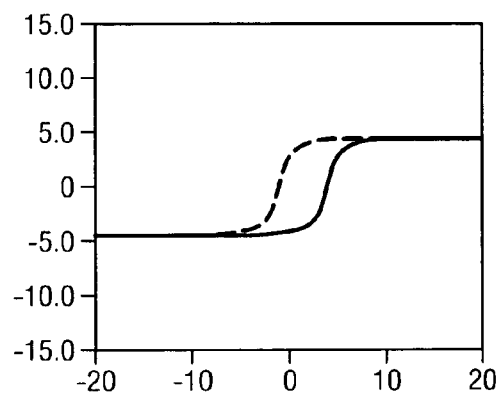
Figure 8A:
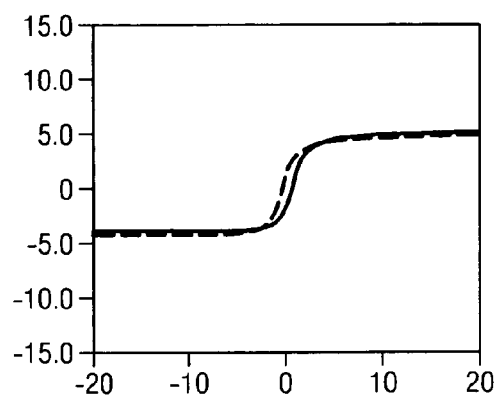
Figure 8B:
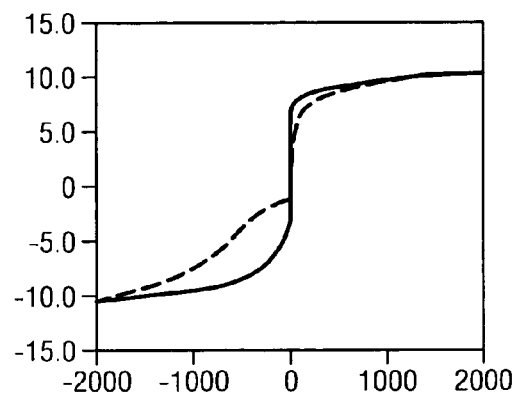
Figure 8C:
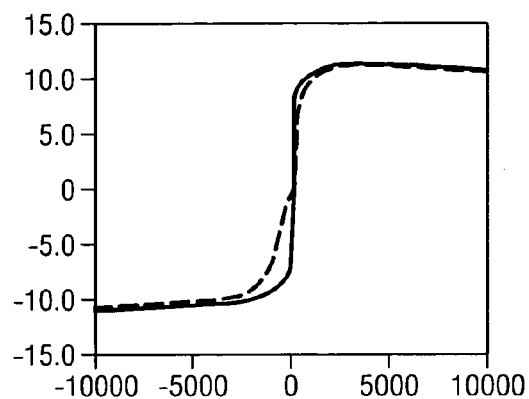
Figure 8D:
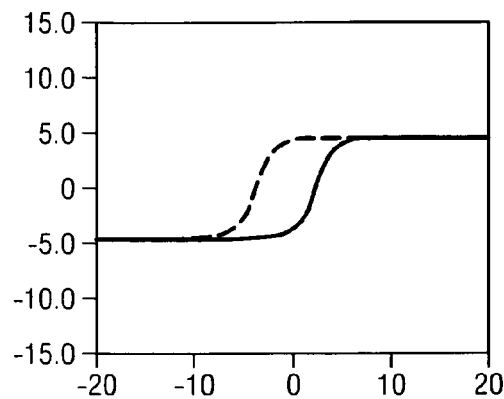
Figure 9A:
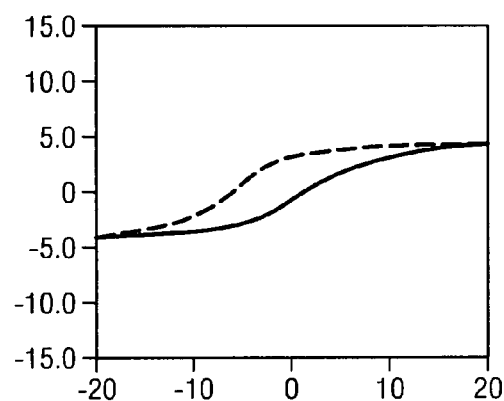
Figure 9B:
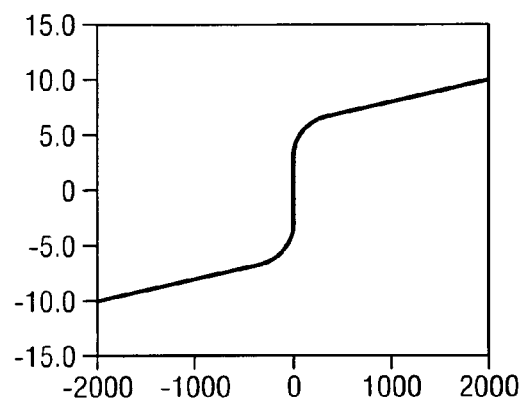
Figure 9C:
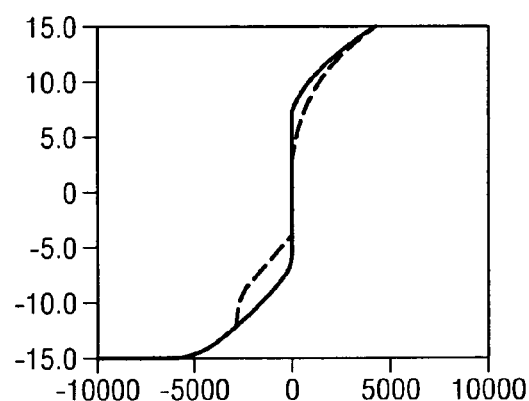
Figure 9D:
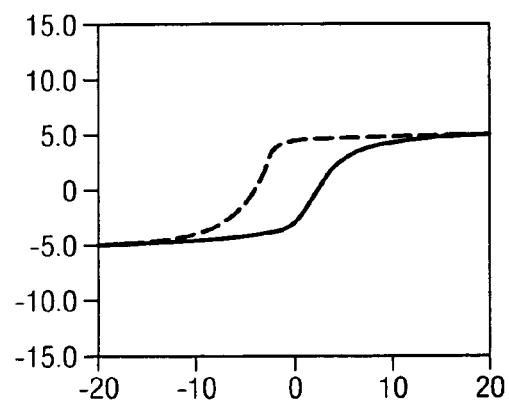
Figure 10A:
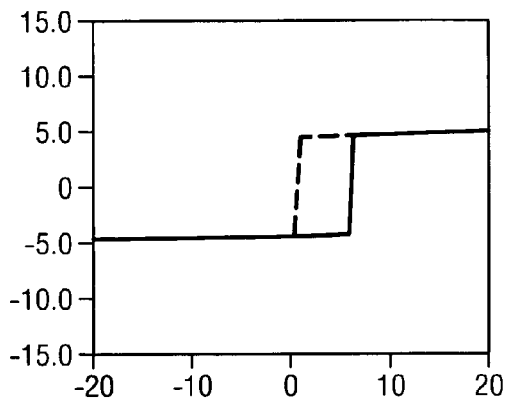
Figure 10B:
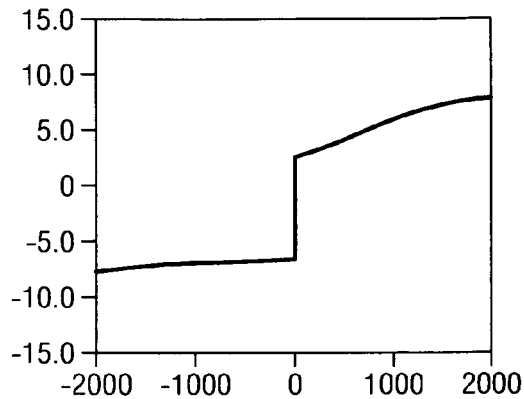
Figure 10C:
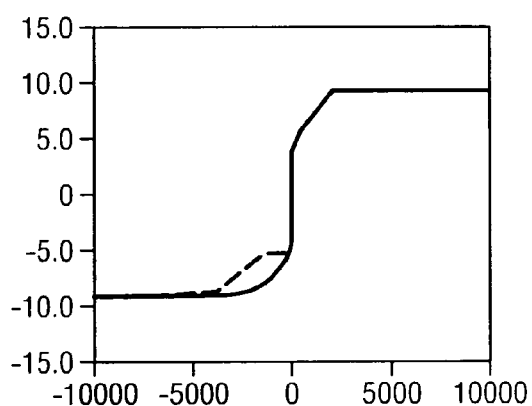
Figure 10D:
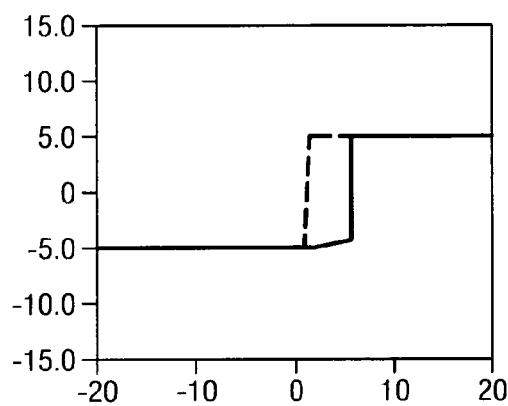

Another problem that can occur in a MTJ memory cell 202 such as the one shown in FIG. 3 is that Neel coupling can occur between the first magnetic layer ML1 and the second magnetic layer ML2 due to the surface roughness of the tunnel barrier layer TL. Smoothing the surface of a tunnel barrier layer TL results in decreased Neel coupling. The diffusion barrier 326 improves the smoothness of subsequently formed layers 316 and TL, as described above. In addition, in accordance with an embodiment of the present invention, the tunnel barrier layer TL surface of MTJ memory cell 302 of FIG. 4 may be further smoothed by disposing an amorphous material between the tunnel barrier layer TL and the spacer of the anti-parallel layer, as shown in FIG. 6, to be described further herein. Thus, the MTJ memory cell 302 having a diffusion barrier 326 between the anti-ferromagnetic layer 304 and the pinned layer 306 shown in FIG. 4 may be further improved by including an amorphous material layer at a top surface of the anti-parallel layer 316 adjacent to the tunnel barrier layer TL, which reduces or eliminates Neel coupling (not shown in FIG. 4; see FIG. 6), to be described further herein. For example, the reference layer 310 may comprise an amorphous material.

Generally, the performance of the MTJ 302, with regard to its thermal stability and its magnetic and magneto-transport properties, may be improved by inserting one or more diffusion barrier layers, in the form of thin amorphous ferromagnetic material layers, at various positions within the pinned layer stack comprised of the anti-parallel layer 316 and above and/or below the anti-parallel layer 316. Thus, one or both of the ferromagnetic layers comprising the AP layer, 306 and 310, may be replaced by a thin amorphous ferromagnetic layer, or a diffusion layer may be inserted at the top or bottom surfaces of either of the layers 306 and 310, or may be inserted at a position within the interior of either or both of the layers 306 and 310. For example, it may be preferable for the highest tunneling magnetoresistance values to have the amorphous diffusion barrier layer not positioned adjacent to the tunnel barrier layer TL, but positioned away from this interface by a thickness of about 4 or more Angstroms, as described further below. Similarly, one or more diffusion barriers may be placed at the top or bottom surfaces of the free layer or within the interior of the free layer 314, also described further below.

In particular, an amorphous material layer may also be disposed within the free layer 314 (not shown in FIG. 4; see FIG. 5), also to be described further herein. Or, alternatively, an amorphous material layer may be disposed at a top surface of the anti-parallel layer 316 adjacent the tunnel barrier layer TL (FIG. 6) and an amorphous material layer may be disposed within the free layer 314 (FIG. 5), in addition to the use of the diffusion barrier 326.

Figure 5:
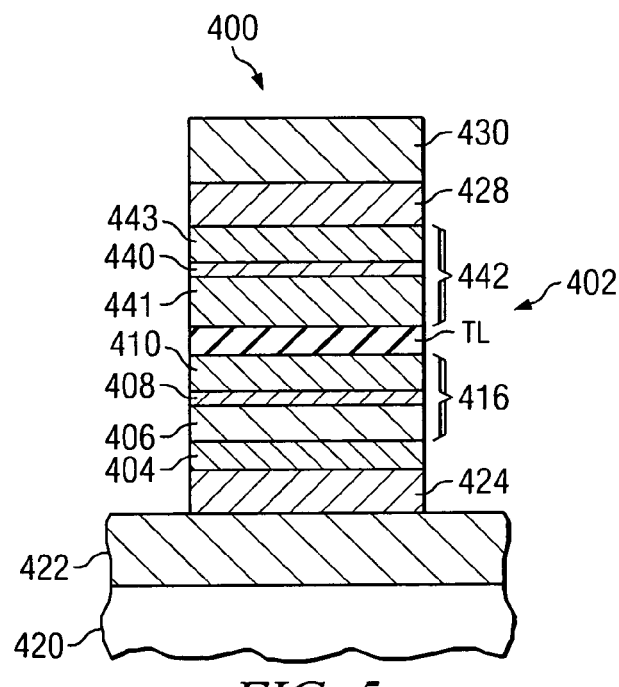
FIG. 5 shows a cross-sectional view of an MTJ memory cell in accordance with another embodiment of the present invention, wherein an amorphous ferromagnetic (FM) layer is disposed within a free layer of the MTJ memory cell.

FIG. 5 shows a cross-sectional view of an MTJ memory cell 402 in accordance with another embodiment of the present invention, wherein an amorphous ferromagnetic (FM) layer 440 is disposed within a free layer 442 of the MTJ memory cell 402. Like numerals are used for the various elements described in FIG. 4. To avoid repetition, each reference number shown in the diagram is not described again in detail herein. Rather, similar materials x02, x04, x06, x08, etc., are preferably used for the material layers shown as were described for FIG. 4, where x=3 in FIG. 4 and x=4 in FIG. 5. As an example, the preferred and alternative materials and dimensions described for anti-ferromagnetic layer 304 in the description for FIG. 4 are preferably also used for anti-ferromagnetic layer 404 in FIG. 5.

In this embodiment, after forming the tunnel barrier layer TL, a free layer 442 comprising an amorphous material 440 is formed over the tunnel barrier layer TL. For example, a magnetic material 441 such as CoFe is deposited over the tunnel barrier layer TL, an amorphous material 442 is deposited over the magnetic material 441, and a magnetic material 443 is deposited over the amorphous material 442. The amorphous material 440 preferably comprises a thickness of about 50 Å or less, for example, although alternatively, the amorphous material 440 may comprise other dimensions. The amorphous material 440 of the free layer 442 may comprise Co, Fe, or Ni combined with glass forming elements such as B, P, Si, Mo, Zr, Nb, Hf, Gd, Tb, or combinations thereof, as examples. The choice of the glass forming elements is determined by the required thermal stability of the resulting MTJ cell together with the required magnetic switching properties of the free layer. Thus, it may be preferred not to use glass forming elements comprised of the rare-earth elements which may significantly magnetically harden the free layer. Or, alternatively, magnetic materials 441 and 443 may not be used, and the free layer 442 may comprise the amorphous material 440, in one embodiment of the present invention.

The use of an amorphous material 440 is advantageous when used in the free ferromagnetic layer 442 of a MTJ memory cell 402 because the lack of crystalline structure of the amorphous material 440 results in reduced or close to zero magneto crystalline anisotropy. This leads to greater reproducibility of magnetic switching of the free layer 442 magnetic moment, because the properties of otherwise similarly sized and shaped MTJ memory cells are not affected by the likely different number and distribution of sizes of crystalline grains found for crystalline materials. These properties improve the magnetic switching characteristics of the MTJ memory cell 402 having an amorphous material 440 in the free layer 442.

The MTJ memory cell 402 may also include an optional diffusion barrier disposed between the pinned layer 406 and the anti-ferromagnetic layer 404, (not shown in FIG. 5; see FIGS. 4 and 6). The diffusion barrier may comprise an amorphous material or a NiFe alloy, and may comprise the same materials and dimensions as described for the diffusion barrier 326 of FIG. 4, for example.

FIG. 6 shows a cross-sectional view of an MTJ memory cell 502 in accordance with yet another embodiment of the present invention, wherein an amorphous ferromagnetic layer 550 is disposed adjacent to the bottom surface of the tunnel barrier layer TL. Again, like numerals are used for the various elements described in FIG. 4, and to avoid repetition, each reference number shown in the diagram is not described again in detail herein. Rather, similar materials x02, x04, x06, x08, etc., are preferably used for the material layers shown as were described for FIG. 4, where x=3 in FIG. 4 and x=5 in FIG. 6. As an example, the preferred and alternative materials and dimensions described for the anti-ferromagnetic layer 304 in the description for FIG. 4 are preferably also used for anti-ferromagnetic layer 504 in FIG. 6.

In the embodiment shown in FIG. 6, the reference layer 552 of the antiparallel layer 554 includes an amorphous material 550 directly adjacent and abutting the tunnel barrier layer TL. While two layers 510 and 550 are shown in FIG. 6, the reference layer 552 may comprise a single layer of amorphous material 550, comprising about 5 to 30 Å of a CoFe based alloy. For example, the reference layer 552 may include an amorphous material 550 such as CoFeB. Alternatively, in another embodiment, the reference layer 552 may comprise a bilayer including a first layer of CoFe 510 and a second layer of amorphous material 550 such as the amorphous materials described for diffusion barrier 326 of FIG. 4, as examples, disposed over the first layer of CoFe 510 and being adjacent and abutting the tunnel barrier layer TL, as shown. The reference layer 552 may also comprise three or more layers, with at least the top layer 550 adjacent and abutting the tunnel barrier layer TL, the top layer 550 preferably comprising an amorphous material. The amorphous layer 550 may alternatively not be adjacent to the tunnel barrier layer TL but may be positioned anywhere within the layer 552, and the amorphous layer 550 may, for example, be surrounded on both sides by other ferromagnetic layers comprised of CoFe, for example (not shown).

The amorphous material 550 may comprise Co, Fe, or Ni combined with B, P, Si, Mo, Zr, Nb, Hf, Gd, Tb, or combinations thereof, as examples. The amorphous material 550 preferably comprises a thickness of about 20 Å or less, for example, although alternatively, the amorphous material 550 may comprise other dimensions. If an amorphous material 550 is disposed adjacent to the tunnel barrier layer TL, experimental results show that an MTJ memory cell 502 having almost no Neel coupling may be achieved.

Experiments have shown synergistic effects of using the diffusion barrier layer and amorphous ferromagnetic material layers in a MTJ memory cell as described herein. For example, the smoother growth of the tunnel barrier leads to a better homogeneity of the barrier and thus to higher MR and RA for otherwise identical conditions for the formation of the barrier. Also, the distribution of the resistances of MTJ-cells in a resistive array can be improved.

1. Experimental Results: CoFeB in Anti-Parallel Layer

Tables 1 and 2 show some experimental results of manufacturing MTJ memory cells in accordance with embodiments of the present invention compared with MTJ memory cells manufactured in accordance with prior art methods. Table 1 shows Current In-Plane Transport (CIPT) data, and Table 2 shows Kerr data. The CIPT technique allows for the measurement of the magneto-transport properties of magnetic tunnel junction structures without the need for elaborate methods to pattern small devices with electrical contacts to the bottom and top of the patterned devices. Unpatterned films can be used, as described in the paper by Worledge, D. C. & Trouilloud, P. L. entitled "Magnetoresistance Measurement of Unpatterned Magnetic Tunnel Junction Wafers by Current-In-Plane Tunneling," *Appl. Phys. Lett.* 83, 84–86 (2003), which is incorporated herein by reference. The experimental results 1 through 15 were performed for a structure 302 such as the one shown in FIG. 4 comprising a base layer 324 comprised of a first 50 Å TaN layer and a second 50 Å Ta layer disposed over the TaN layer. The anti-ferromagnetic layer 304 comprised 175 Å of PtMn, and the anti-parallel layer 316 comprised the materials listed for the anti-parallel bottom layer 306, spacer 308, and anti-parallel top layer 310 shown in Tables 1 and 2. The structure 300 included a tunnel barrier layer TL of 9 Å of $Al_2O_3$, and the free layer 314 comprised 50 Å of NiFe. The cap layer 328 comprised 100 Å of TaN.

310 comprise two or more layers, the materials are listed left to right which corresponds to bottom to top layers in the structure 300 shown in FIG. 4, for example. In Table 1, MR is the magnetoresistance of the MTJ memory cell 302 for each experiment, expressed as a percentage of the change in resistance of the MTJ memory cell 302 divided by the minimum resistance of the MTJ memory cell 302, multiplied by 100. RA represents the resistance of an MTJ magnetic cell 302 multiplied by its area, and is expressed in $\Omega\mu m^2$. Data are shown after annealing the devices at temperatures of 280° C. for 2 hours and 350° C. for 1 hour, respectively.

The experiments 1 through 15 shown in Tables 1 and 2 show that the material layers described in embodiments of the invention herein may be combined in various ways to achieve an MTJ memory cell having low Neel coupling, high thermal stability, high magnetoresistance, and high RA. As one example, experimental results show that using an amorphous material 550 such as CoFeB adjacent to the tunnel barrier layer TL, where the tunnel barrier layer TL comprises $Al_2O_3$ and the free layer 514 comprises NiFe, as shown in FIG. 6, results in high MR of about 40%, good thermal stability, and a high RA (see experiment 1), com-

TABLE 1

| | | | CIPT Data | | | |
|---|---|---|---|---|---|---|
| | | | 280° C., 2 hours | | 350° C., 1 hour | |
| Experiment No. | APL Bottom 306 | Spacer 308 | APL Top 310 | MR | RA | MR | RA |
| 1 | 18CoFe | 9Ru | 05CoFe/13CoFeB | 40 | 9097 | 27 | 7922 |
| 2 | 18CoFe | 9Ru | 05CoFeB/13CoFe | 33 | 3480 | 26 | 3812 |
| 3 | 24CoFe | 9Ru | 18CoFe | 24 | 2627 | 23 | 1775 |
| 4 | 5CoFe/8CoFeB/5CoFe | 9Ru | 05CoFe/12CoFeB | 39 | 6437 | 26 | 7215 |
| 5 | 5NiFe/5CoFeB/8CoFe | 9Ru | 18CoFe | 29 | 2527 | 23 | 2832 |
| 6 | 5NiFe/13CoFe | 9Ru | 18CoFe | 24 | 2785 | 23 | 1841 |
| 7 | 18CoFe | 9Ru | 18CoFe | 24 | 2860 | 20 | 1580 |
| 8 | 18CoFe | 9Ru | 05NiFe/13CoFeB | 38 | 6899 | 23 | 6146 |
| 9 | 5CoFe/8CoFeB/5CoFe | 9Ru | 05CoFe/08CoFeB/05CoFe | 33 | 5211 | 25 | 5484 |
| 10 | 24NiFe | 9Ru | 18CoFe | 23 | 2619 | 20 | 1742 |
| 11 | 8CoFe/8CoFeB/8CoFe | 9Ru | 08CoFe/12CoFeB | 37 | 6945 | 24 | 7415 |
| 12 | 5CoFeB/13CoFe | 9Ru | 18CoFe | 28 | 2681 | 21 | 3082 |
| 13 | 18CoFe | 9Ru | 18CoFeB | 44 | 6036 | 30 | 6564 |
| 14 | 5NiFe/5CoFeB/10CoFe | 9Ru | 18CoFe | 31 | 2417 | 23 | 2857 |
| 15 | 18CoFe | 9Ru | 05NiFe/13CoFe | 25 | 2754 | 21 | 1744 |

In Table 1, the units for the material layers 306, 308, and 310 are in Angstroms, and the material layers 306, 308, and pared with using a non-amorphous material such as CoFe adjacent the tunnel barrier layer TL (see experiment 2).

TABLE 2

| | | | Kerr Data | | | |
|---|---|---|---|---|---|---|
| | | | 280° C., 2 hours | | 350° C., 1 hour | |
| Experiment No. | APL Bottom 306 | Spacer 308 | APL Top 310 | Neel | Plateau | Neel | Plateau |
| 1 | 18CoFe | 9Ru | 05CoFe/13CoFeB | 2.6 | 1,000 | 2.4 | 1,100 |
| 2 | 18CoFe | 9Ru | 05CoFeB/13CoFe | 5.0 | 1,100 | 4.1 | 750 |
| 3 | 24CoFe | 9Ru | 18 CoFe | 4.9 | 1,400 | 4.4 | 1000 |
| 4 | 5CoFe/8CoFeB/5CoFe | 9Ru | 05CoFe/12CoFeB | 2.9 | 600 | 2.8 | 300 |
| 5 | 5NiFe/5CoFeB/8CoFe | 9Ru | 18CoFe | 8.5 | 700 | 6.4 | 500 |
| 6 | 5NiFe/13CoFe | 9Ru | 18CoFe | 5.2 | 1,150 | 4.3 | 1,100 |
| 7 | 18CoFe | 9Ru | 18CoFe | 5.1 | 1,100 | 4.4 | 400 |
| 8 | 18CoFe | 9Ru | 05NiFe/13CoFeB | 2.7 | 550 | 2.2 | 600 |
| 9 | 5CoFe/8CoFeB/5CoFe | 9Ru | 05CoFe/08CoFeB/05CoFe | 4.0 | 550 | 3.7 | 200 |

TABLE 2-continued

| | | | Kerr Data | | | |
| | | | 280° C., 2 hours | | 350° C., 1 hour | |
| Experiment No. | APL Bottom 306 | Spacer 308 | APL Top 310 | Neel | Plateau | Neel | Plateau |
| --- | --- | --- | --- | --- | --- | --- | --- |
| 10 | 24NiFe | 9Ru | 18CoFe | 6.1 | 400 | 5.1 | 500 |
| 11 | 8CoFe/8CoFeB/8CoFe | 9Ru | 08CoFe/12CoFeB | 3.6 | 600 | 3.3 | 600 |
| 12 | 5CoFeB/13CoFe | 9Ru | 18CoFe | 8.4 | 800 | 6.0 | 200 |
| 13 | 18CoFe | 9Ru | 18CoFeB | 1.8 | 1,150 | 2.4 | 1,100 |
| 14 | 5NiFe/5CoFeB/10CoFe | 9Ru | 18CoFe | 8.6 | 850 | 6.4 | 650 |
| 15 | 18CoFe | 9Ru | 05NiFe/13CoFe | 5.4 | 700 | 4.7 | 300 |

Table 2 shows Kerr data, which is used to characterize magnetic properties of an MTJ, for the same experiments shown in Table 1, wherein the Neel coupling is shown in units of Oe, and the Plateau represents the stability of the reference system versus a magnetic field and is measured in Oe. The composition of the CoFeB material shown in Tables 1 and 2 comprised about 75 atomic % of CoFe and about 25 atomic % B, wherein the CoFe comprised about 70 atomic % Co and about 30 atomic % Fe.

2. Experimental Results: Temperatures at Which CoFeB Crystallizes

Table 3 shows experimental results using an amorphous material in a free layer of an MTJ memory cell in accordance with an embodiment of the present invention, e.g., as shown in FIG. 5 at 400.

TABLE 3

| Experiment No. | Alloy/Cap Layer | Crystallization Temperature |
| --- | --- | --- |
| 16 | $(Co_{84}Fe_{16})_{80}B_{20}/Ta_{40}Cr_{60}$ | 320° C. |
| 17 | $(Co_{84}Fe_{16})_{80}B_{20}/Ta_{50}Cr_{50}$ | 320° C. |
| 18 | $(Co_{84}Fe_{16})_{80}B_{20}/TaN$ | 380° C. |
| 19 | $(Co_{84}Fe_{16})_{85}B_{15}/Ta_{40}Cr_{60}$ | 300° C. |
| 20 | $(Co_{84}Fe_{16})_{85}B_{15}/Ta_{50}Cr_{50}$ | 300° C. |
| 21 | $(Co_{84}Fe_{16})_{85}B_{15}/TaN$ | 340° C. |
| 22 | $(Co_{70}Fe_{30})_{85}B_{15}/Ta$ | 360° C. |
| 23 | $(Co_{70}Fe_{30})_{85}B_{15}/TaN$ | 400° C.+ |

Again, in Table 3, the various material layers are shown in Angstroms, with materials listed left to right representing bottom to top material layers in the MTJ memory cell 402 structure. It was found that CoFeB has the highest crystallization temperature when placed in contact with a TaN cap layer. Furthermore, $(Co_{70}Fe_{30})_{85}B_{15}/TaN$ is amorphous and remains amorphous even after a 400° C. anneal. Thus, an unexpected result found in experiments 16 through 23 shown in Table 3 is that it is advantageous to use a TaN cap layer 428 disposed over an amorphous material layer 440 disposed in a free layer 442 of an MTJ memory cell 402, because the TaN in the cap layer 428 increases the temperature at which the amorphous material 440 will crystallize during thermal cycling of the MTJ memory cell 402.

3. Experimental Results: NiFe as Pinned Layer

With reference to FIG. 4, in one embodiment of the present invention, no diffusion barrier 326 is included in the MTJ memory cell 302 structure. Rather, the pinned layer 306 comprises NiFe, which functions not only as a pinned layer of the anti-parallel layer 316, but also as a diffusion barrier to improve thermal stability and prevent diffusion of Mn from the underlying anti-ferromagnetic layer 304. Table 4 shows experimental results of four types of structures.

TABLE 4

| Experiment No. | Anti-parallel layer 306 | Results |
| --- | --- | --- |
| 24 | 18CoFe/09Ru/18CoFe | medium thermal stability |
| 25 | 10CoFe/03Al/10CoFe/09Ru/18CoFe | poor thermal stability |
| 26 | 18CoFe/09Ru/36CoFe/09Ru/18CoFe | poor switching |
| 27 | 24NiFe/09Ru/18CoFe | improved thermal stability |

In Table 4, the dimensions are in Angstroms and the materials listed left to right represent bottom to top material layers in the MTJ memory cell 302 structure. In each experiment 24 through 27, the anti-ferromagnetic layer 304 comprises 175 Å of PtMn. The switching characteristics of each device were measured after a 375° C. anneal for 1 hour. The results of experiments 24–27 show that using NiFe (80 atomic % Ni and 20 atomic % Fe) as the pinned layer 306 significantly improves the thermal stability of the MTJ memory cell 302.

4. Experimental Results: Switching Characteristics

FIGS. 7A–7D contain Kerr data showing the switching characteristics of MTJ memory cells 302 tested in experiment 24, above. Likewise, FIGS. 8A–8D through 10A–10D contain Kerr data showing the switching characteristics of MTJ memory cells 302 tested in experiments 25 through 27, respectively. The units of the abscissa of the plots in FIG. 7A–7D through 10A–10D are the magnetic field in Oe. The units of the ordinate are arbitrary and reflect the signal strength of the Kerr rotation which is approximately proportional to the magnetic moment of the device structure (e.g., the Kerr signal from lower magnetic layers in the device structure is attenuated compared to the Kerr signal from layers of the same thickness closer to the surface of the structure). A hysteresis curve is the desired shape of the curves shown in FIGS. 7A–10D, in order to successfully switch the free layer magnetic state of an MTJ memory cell. The MTJ memory cell 302 with NiFe as a pinned layer 306 has excellent switching characteristics, as can be seen in FIGS. 10A–10D. In experiment 27, shown in FIGS. 10A–10D, good coupling was found between the NiFe pinned layer 306 and CoFe reference layer 310 across the Ru spacer 308.

5. Experimental Results: Thermal Stability

Figure 11:
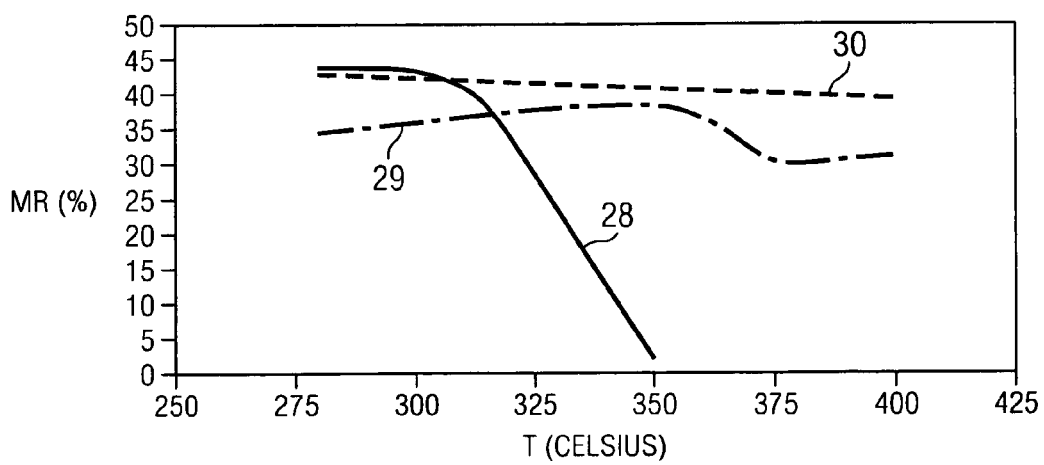
FIG. 11 shows a graphical comparison of the magnetoresistance at various anneal temperatures for an MTJ having no buffer layer and MTJ's having amorphous buffer layers with improved thermal stability in accordance with embodiments of the present invention.

FIG. 11 comprises a graph illustrating an improvement in thermal stability using an amorphous buffer layer 326 as shown in FIG. 4, wherein the MTJ 302 includes a buffer layer 326 comprising CoFeB. The target composition of the buffer layer 326 comprises (Co75Fe25)80B20, and the actual CoFeB buffer layer 326 film composition of the experiment was (Co75Fe25)75B25. For example, line 28 illustrates the magnetoresistance (MR) vs. anneal temperature of an MTJ 202 having no buffer layer (as shown in FIG. 3). Line 29 illustrates the magnetoresistance of an MTJ 302 having a buffer layer 326 (see FIG. 4) comprising about 5 Å of CoFeB. Line 30 illustrates the magnetoresistance of an MTJ 302 having a buffer layer 326 comprising about 15 Å of CoFeB. At 350 degrees C., the MR of the MTJ having no buffer layer is less than 5%, and MTJ's 302 having an amorphous buffer layer 326 have a MR of about 40% and 32% (shown at line 30 and 29, respectively) at 400 degrees C., as shown. Similar test results were achieved using a buffer layer 326 having a target composition of Co67Fe4 Mo1Si17B11, indicating improved thermal stability by the use of an amorphous buffer layer 326.

The amorphous ferromagnetic materials described herein for use as diffusion barriers 326/526 in FIGS. 4 and 6, disposed beneath a tunnel barrier layer TL in an anti-parallel layer 554, shown at 550 in FIG. 6, and in a free layer 442, shown in FIG. 5, are advantageous for several reasons. Amorphous alloys with 3d transition magnetic elements are soft, and the coercitivity $H_c$ can be very small. This is advantageous because the write currents required to switch the amorphous materials can be small. Furthermore, amorphous ferromagnetic alloys exhibit high elastic limits (i.e. they resist plastic deformation, as lack of ordered atomic lattice implies lack of easy motion of dislocations) and show good corrosion resistance in certain composition ranges, as an absence of grain boundaries along which contaminants can diffuse. Additionally, in many cases the magnetic moment of the amorphous alloys is reduced compared to their crystalline counterpart materials. The Curie temperature and magnetostriction depend on alloy composition. Zero magnetostriction for the free layer of an MTJ memory cell can be achieved with appropriate choice of the alloy composition. The doping of permalloy with a rare earth material also influences the Landau-Lifshitz-Gilbert damping constant, "α." Furthermore, in case of Tb doping of permalloy it has been shown that doping significantly increases α. The increased damping constant α facilitates faster switching of the MTJ storage element or memory cell, and this is particularly advantageous in MRAM applications, as described in U.S. Pat. No. 6,452,240, entitled, "Increased Damping of Magnetization in Magnetic Materials," issued on Sep. 7, 2002 to Ingvarsson, et al., which is incorporated herein by reference. Amorphous ferromagnetic materials may be sputter-deposited with a variety of different constituents and compositions, by including the dopants or constituents in the sputter target, for example.

Figure 1:
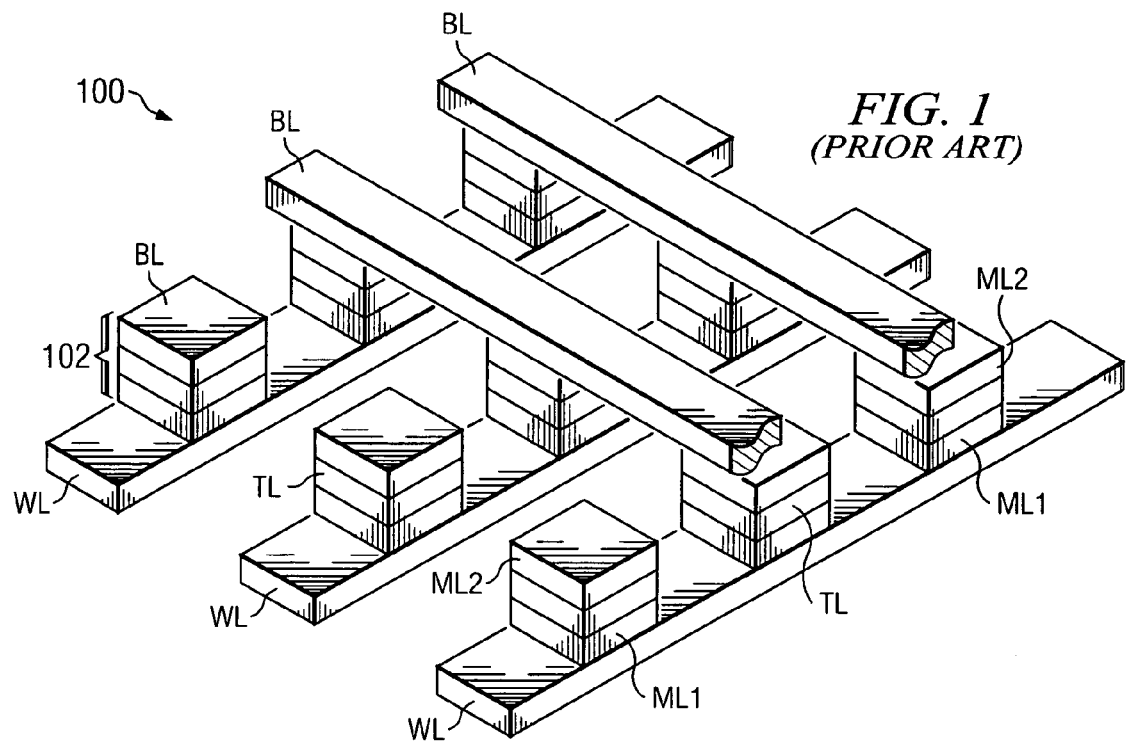
FIG. 1 illustrates a perspective view of a prior art MRAM device having magnetic stack memory cells arranged in an array, with wordlines and bitlines disposed below and above each memory cell for accessing the memory cells.
Figure 2A:
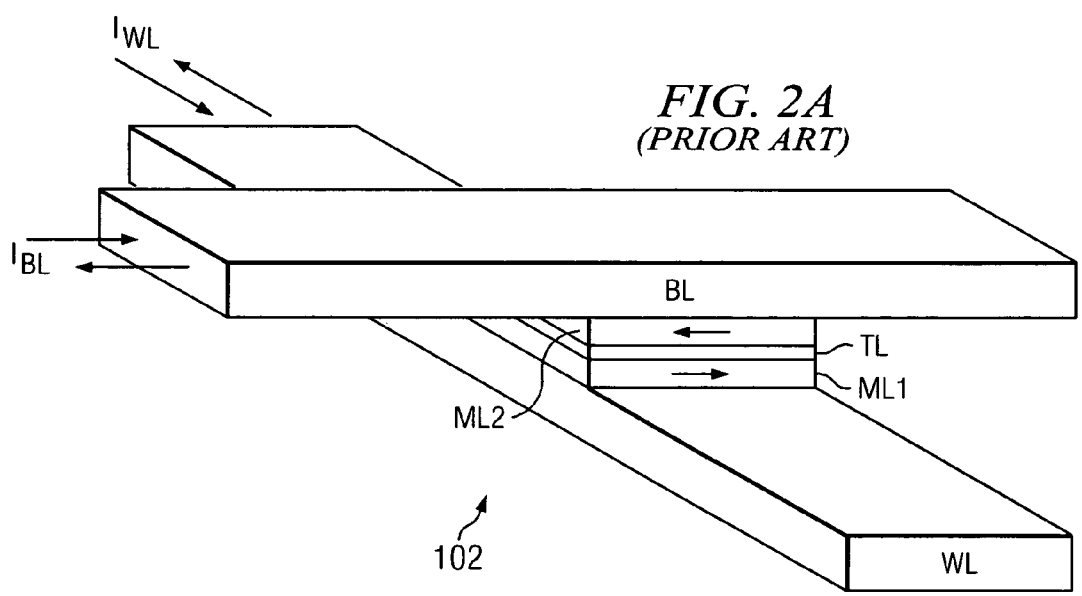
FIG. 2A through 2C illustrate a single magnetoresistive memory cell and the currents used to program the cell.
Figure 2B:
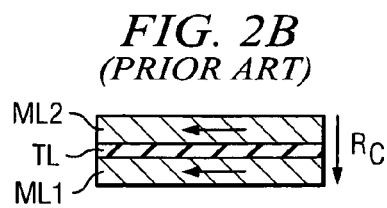
Figure 2C:
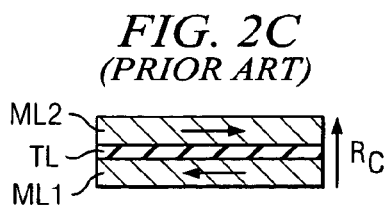

The MTJ memory cells 302, 402, 502 described herein with reference to FIGS. 3, 4, and 5 may be used in MRAM arrays such as the one shown in FIG. 1. Embodiments of the present invention include methods of manufacturing the MTJ memory cells 302, 402, 502. Embodiments of the present invention also include MRAM arrays utilizing the MTJ memory cells 302, 402, 502 described herein.

The anti-parallel layers 316, 416, 554 described herein may also be referred to as a reference system. Referring again to FIG. 4, the diffusion barriers described herein are also useful when used in reference systems comprising a plurality of spacers 308 and a plurality of ferromagnetic layers 306 and 310 disposed about each spacer 308. For example, a reference system 316 may comprise a plurality of layers function as a reference system 316, e.g., a ferromagnetic (FM) layer 1/Spacer1/FM2/Spacer2/FM3, etc. In a reference system 316 having more than one non-magnetic spacer layer 308 disposed between a plurality of ferromagnetic layers 306 and 310, some spacers 308 may provide anti-parallel coupling, while other spacers 308 may provide parallel coupling for the reference system 316. In such a reference system 316, the diffusion barrier 326 described herein may be disposed between the reference system 316 and an adjacent anti-ferromagnetic layer 304, and/or the ferromagnetic layers may comprise a bilayer or trilayer, with one layer of the bilayers or trilayers comprising a diffusion barrier material layer such as an amorphous alloy, for example. A diffusion barrier comprising an amorphous ferromagnetic material may be disposed between one of the spacers and an adjacent ferromagnetic layer.

Advantages of embodiments of the invention include enhancing the thermal stability of MTJ memory cells by disposing a diffusion barrier between an anti-ferromagnetic layer and a pinned layer of an anti-parallel layer, and reducing Neel coupling of the MTJ memory cells by disposing an amorphous material abutting a tunnel barrier layer TL. An MTJ having improved electrical and magnetic performance, and thus being compatible with CMOS processes, is achieved by embodiments of the present invention. The use of TaN as a base layer and as a cap layer further improves the performance of the MTJ memory cells. Embodiments of the present invention result in improved device yields and cost savings.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A magnetic tunnel junction memory cell, comprising:
an anti-ferromagnetic layer;
a diffusion barrier layer disposed over and adjacent the anti-ferromagnetic layer;
an anti-parallel magnetic layer disposed over the anti-ferromagnetic layer, the anti-parallel magnetic layer comprising a pinned layer, a spacer disposed over the pinned layer, and a reference layer disposed over the spacer;
a tunnel baffler layer disposed over the anti-parallel magnetic layer; and
a free magnetic layer disposed over the tunnel barrier layer.

2. The magnetic tunnel junction memory cell according to claim 1, wherein the diffusion barrier layer comprises an amorphous material.

3. The magnetic tunnel junction memory cell according to claim 2, wherein the amorphous material comprises a Co alloy, a Fe alloy or a Co—Fe alloy.

4. The magnetic tunnel junction memory cell according to claim 3, wherein the diffusion barrier layer and the pinned layer are the same layer.

5. The magnetic tunnel junction memory cell according to claim 2, wherein the amorphous material comprises Co, Fe, Ni, or a combination thereof, combined with B, P, Si, Mo, Zr, Nb, Hf, Gd, Tb, or a combination thereof.

6. The magnetic tunnel junction memory cell according to claim 5, wherein the Go, Fe, Ni, or combination thereof comprises about 70–90 atomic % of the amorphous material, and wherein the B, P, Si, Mo, Zr, Nb, Hf, Gd, Tb, or combination thereof comprises about 10–30 atomic % of the amorphous material.

7. The magnetic tunnel junction memory cell according to claim 6, wherein the amorphous material comprises about 75 atomic % CoFe and about 25 atomic % B, and wherein the CoFe of the amorphous material comprises about 70 atomic % Co and about 30 atomic % Fe.

8. The magnetic tunnel junction memory cell according to claim 2, wherein the diffusion barrier layer comprises a bilayer or a trilayer.

9. The magnetic tunnel junction memory cell according to claim 8, wherein at least one layer of the bilayer or trilayer comprises a CoFeB based alloy.

10. The magnetic tunnel junction memory cell according to claim 9, wherein at least one layer of the bilayer or trilayer comprises CoFe.

11. The magnetic tunnel junction memory cell according to claim 1, wherein the anti-ferromagnetic layer comprises Mn, wherein the diffusion barrier layer prevents diffusion of the Mn into the spacer of the anti-parallel magnetic layer.

12. The magnetic tunnel junction memory cell according to claim 1, wherein the diffusion baffler layer comprises a thickness of about 20 Å or less.

13. The magnetic tunnel junction memory cell according to claim 1, wherein the anti-parallel magnetic layer comprises a Neel coupling reducing layer adjacent the tunnel barrier layer.

14. The magnetic tunnel junction memory cell according to claim 13, wherein the Neel coupling reducing layer comprises an amorphous material.

15. The magnetic tunnel junction memory cell according to claim 14, wherein the Neel coupling reducing layer comprises a CoFcB-based alloy.

16. The magnetic tunnel junction memory cell according to claim 14, wherein the Neel coupling reducing layer comprises a thickness of about 20 Å or less.

17. The magnetic tunnel junction memory cell according to claim 1, further comprising a base layer disposed beneath the anti-ferromagnetic layer, and a cap layer disposed over the free magnetic layer.

18. The magnetic tunnel junction memory cell according to claim 17, wherein the base layer comprises a bilayer of TaN and Ta, and wherein the cap layer comprises TaN.

19. The magnetic tunnel junction memory cell according to claim 17, wherein the base layer comprises a thickness of about 100 Å or less, and wherein the cap layer comprises a thickness of about 100 Å.

20. The magnetic tunnel junction memory cell according to claim 1, wherein the anti-ferromagnetic layer comprises about 80 to 300 Å of PtMn, wherein the tunnel barrier layer comprises about 20 Å or less of $Al_2O_3$, and wherein the spacer comprises about 15 Å or less of Ru.

21. The magnetic tunnel junction memory cell according to claim 1, wherein the free magnetic layer comprises an amorphous ferromagnetic alloy.

22. The magnetic tunnel junction memory cell according to claim 21, wherein the amorphous ferromagnetic alloy of the free magnetic layer comprises Co, Fe, Ni, or a combination thereof, combined with B, P, Si, Mo, Zr, Nb, Hf, Gd, Tb, or a combination thereof.

23. The magnetic tunnel junction memory cell according to claim 22, wherein the Go, Fe, Ni, or combination thereof comprises about 70–90 atomic % of the amorphous ferromagnetic alloy, and wherein the B, P, Si, Mo, Zr, Nb, Hf, Gd, Tb, or combination thereof comprises about 10–30 atomic % of the amorphous ferromagnetic alloy.

24. The magnetic tunnel junction memory cell according to claim 23, wherein the amorphous ferromagnetic alloy comprises about 75 atomic % CoFe and about 25 atomic % B, and wherein the CoFe of the amorphous ferromagnetic alloy comprises about 70 atomic % Co and about 30 atomic % Fe.

25. The magnetic tunnel junction memory cell according to claim 1, further comprising an amorphous material layer disposed between the tunnel barrier layer and the anti-parallel magnetic layer.

26. The magnetic tunnel junction memory cell according to claim 25, wherein the amorphous material layer comprises about 20 Å or less of Co, Fe, Ni, or a combination thereof combined with B, P, Si, Mo, Zr, Nb, Hf, Gd, Tb, or a combination thereof.

27. The magnetic tunnel junction memory cell according to claim 1, wherein the diffusion barrier layer comprises a NiFe alloy.

28. The magnetic tunnel junction memory cell according to claim 27, wherein the diffusion barrier layer comprises about 60–90 atomic % Ni and about 10–40 atomic % Fe.

29. The magnetic tunnel junction memory cell according to claim 27, wherein the diffusion barrier the pinned layer arc the same layer.

30. The magnetic tunnel junction memory cell according to claim 1, wherein the anti-parallel magnetic layer comprises a plurality of spacers, each spacer having a first side and a second side, wherein a ferromagnetic layer is disposed adjacent the first side and the second side of the plurality of spacers.

31. The magnetic tunnel junction memory cell according to claim 30, further comprising an amorphous diffusion barrier between at least one spacer and an adjacent ferromagnetic layer.

32. A magnetic random access memory (MRAM) device comprising at least one magnetic tunnel junction memory cell according to claim 1.

33. The magnetic tunnel junction memory cell according to claim 1 wherein the diffusion barrier layer is a separate later and comprises an amorphous material between the anti-ferromagnetic layer and the anti-parallel magnetic layer.

34. The magnetic tunnnel junction memory cell according to claim 1 wherein the diffusion barrier layer is a separate layer and comprises a NiFe alloy between the anti-ferromagnetic layer and the anti-parallel magnetic layer.

35. A magnetic tunnel junction memory cell, comprising:
an anti-ferromagnetic layer;
an anti-parallel magnetic layer disposed over the anti-ferromagnetic layer;
a tunnel barrier layer disposed over the anti-parallel magnetic layer; and
a free magnetic layer disposed over the tunnel barrier layer, wherein the free magnetic layer comprises a first amorphous ferromagnetic layer disposed within and spaced apart from the tunnel barrier layer.

36. The magnetic tunnel junction memory cell according to claim 35, wherein the first amorphous ferromagnetic layer comprises Co, Fe, Ni, or a combination thereof, combined with B, P, Si, Mo, Zr, Nb, Hf, Gd, Tb, or a combination thereof.

37. The magnetic tunnel junction memory cell according to Claim 35, wherein the Co, Fe, Ni, or combination thereof comprises about 70–90 atomic % of the first amorphous ferromagnetic layer, and wherein the B, P, Si, Mo, Zr, Nb, Hf, Gd, Tb, or combination thereof comprises about 10–30 atomic % of the first amorphous ferromagnetic layer.

38. The magnetic tunnel junction memory cell according to claim 37, wherein the first amorphous ferromagnetic layer comprises about 75 atomic % CoFe and about 25 atomic % B, and wherein the CoFe of the amorphous ferromagnetic layer comprises about 70 atomic % Co and about 30 atomic % Fe.

39. The magnetic tunnel junction memory cell according to claim 36, wherein the first amorphous ferromagnetic layer comprises a thickness of about 50 Å or less.

40. The magnetic tunnel junction memory cell according to claim 36, further comprising a diffusion barrier layer that is a separate layer of material disposed between the anti-ferromagnetic layer and the anti-parallel magnetic layer.

41. The magnetic tunnel junction memory cell according to claim 40, wherein the diffusion barrier layer comprises an amorphous material.

42. The magnetic tunnel junction memory cell according to claim 41, wherein the amorphous material comprises Co, Fe, Ni, or a combination thereof, combined with B, P, Si, Mo, Zr, Nb, Hf, Gd, Tb, or a combination thereof.

43. The magnetic tunnel junction memory cell according to claim 42, wherein the Co, Fe, Ni, or combination thereof comprises about 70–90 atomic % of the amorphous material, and wherein the B, P, Si, Mo, Zr, Nb, Hf, Gd, Tb, or combination thereof comprises about 10–30 atomic % of the amorphous material.

44. The magnetic tunnel junction memory cell according to claim 43, wherein the amorphous material comprises about 75 atomic % CoFe and about 25 atomic % B, and wherein the CoFe of the amorphous material comprises about 70 atomic % Co and about 30 atomic % Fe.

45. The magnetic tunnel junction memory cell according to claim 41, wherein the diffusion barrier layer comprises a bilayer or a trilayer.

46. The magnetic tunnel junction memory cell according to claim 45, wherein at least one layer of the diffusion barrier layer bilayer or trilayer comprises a CoFeB based alloy.

47. The magnetic tunnel junction memory cell according to claim 45, wherein at least one layer of the diffusion barrier layer bilayer or trilayer comprises CoFe.

48. The magnetic tunnel junction memory cell according to claim 40, wherein the anti-ferromagnetic layer comprises Mn, wherein the diffusion barrier layer prevents diffusion of the Mn into the anti-parallel magnetic layer.

49. The magnetic tunnel junction memory cell according to claim 40, wherein the diffusion barrier layer comprises a thickness of about 20 Å or less.

50. The magnetic tunnel junction memory cell according to claim 40, wherein the diffusion hater layer comprises a NiFe alloy.

51. The magnetic tunnel junction memory cell according to claim 50, wherein the diffusion baiter layer comprises about 60–90 atomic % Ni and about 10–40 atomic % Fe.

52. The magnetic tunnel junction memory cell according to claim 35, further comprising a base layer disposed beneath the anti-ferromagnetic layer, and a cap layer disposed over the free layer.

53. The magnetic tunnel junction memory cell according to claim 52, wherein the base layer comprises a bilayer of TaN and Ta, and wherein the cap layer comprises TaN.

54. The magnetic tunnel junction memory cell according to claim 52, wherein the base layer comprises a thickness of about 100 Å or less, and wherein the cap layer comprises a thickness of about 100 Å.

55. The magnetic tunnel junction memory cell according to claim 35, wherein the anti-ferromagnetic layer comprises about 80 to 300 Å of FtMn, and wherein the tunnel barrier layer comprises about 20 Å or less of $Al_{2O3}$.

56. The magnetic tunnel junction memory cell according to claim 35, further comprising a amorphous material layer disposed between the tunnel barrier layer and the anti-parallel magnetic layer.

57. The magnetic tunnel junction memory cell according to claim 56, wherein the amorphous material layer comprises Ca, Fe, Ni, or a combination thereof combined with B, P, Si, Mo, Zr, Nb, Hf, Gd, Tb, or a combination thereof.

58. The magnetic tunnel junction memory cell according to claim 41, wherein the amorphous material of the diffusion barrier layer comprises Ca, Fe, Ni, or a combination thereof having an atomic % of between about 70–90 and B, P, Si, Mo, Zr, Nb, Hf, Gd, Tb, or a combination thereof having an atomic % of the amorphous material of between about 10–30 atomic %.

59. The magnetic tunnel junction memory cell according to claim 58, wherein the amorphous material layer comprises about 75 atomic % CoFe and about 25 atomic % B, and wherein the CoFe of the amorphous material layer campuses about 70 atomic % Co and about 30 atomic % Fe.

60. The magnetic tunnel junction memory cell according to claim 35, wherein the anti-parallel magnetic layer comprises a pinned magnetic layer disposed over anti-ferromagnetic layer, and a reference magnetic layer disposed over the pinned magnetic layer.

61. The magnetic tunnel junction memory cell according to claim 60, further comprising a spacer disposed between the pinned magnetic layer and the reference magnetic layer.

62. The magnetic tunnel junction memory cell according to claim 61, further comprising a diffusion barrier layer disposed between the anti-ferromagnetic layer and the anti-parallel magnetic layer, wherein the anti-ferromagnetic layer comprises Mn, wherein the diffusion barrier layer prevents diffusion of the Mn into the spacer of the anti-parallel magnetic layer.

63. The magnetic tunnel junction memory cell according to claim 62, wherein the diffusion barrier layer comprises about 20 Å or less of an amorphous material.

64. The magnetic tunnel junction memory cell according to claim 63, wherein the amorphous material of the diffusion barrier layer comprises Co, Fe, Ni, or a combination thereof, combined with B, P, Si, Mo, Zr, Nb, Hf, Gd, Tb, or a combination thereof.

65. The magnetic tunnel junction memory cell according to claim 61, wherein the spacer comprises about 15 Å or less of Ru.

66. The magnetic tunnel junction memory cell according to claim 62, wherein the diffusion barrier layer comprises about 20 Å or less of a NiFe alloy.

67. The magnetic tunnel junction memory cell according to claim 66, wherein the diffusion barrier layer comprises about 60–90 atomic % Ni and about 10–40 atomic % Fe.

68. The magnetic tunnel junction memory cell according to claim 35, wherein the anti-parallel magnetic layer comprises a pinned magnetic layer disposed over anti-ferromagnetic layer, and a reference magnetic layer disposed over the pinned magnetic layer.

69. The magnetic tunnel junction memory cell according to claim 68, wherein the pinned layer comprises a second amorphous ferromagnetic layer.

70. The magnetic tunnel junction memory cell according to claim 69, wherein the second amorphous ferromagnetic layer comprises Co, Fe, Ni, or a combination thereof, combined with B, P, Si, Mo, Zr, Nb, Hf, Gd, Tb, or a combination thereof.

71. The magnetic tunnel junction memory cell according to claim 69, wherein the pinned layer comprises a NiFe alloy.

72. The magnetic tunnel junction memory cell according to claim 35, wherein the anti-parallel magnetic layer comprises a plurality of non-magnetic spacers, each spacer having a first side and a second side, wherein a ferromagnetic layer is disposed adjacent the first side and the second side of the plurality of spacers.

73. The magnetic tunnel junction memory cell according to claim 72, further comprising an amorphous ferromagnetic layer disposed between at least one of the spacers and a ferromagnetic layer.

74. A magnetic random access memory (MRAM) device comprising at least one magnetic tunnel junction memory cell according to claim 35.

* * * * *

UNITED STATES PATENT AND TRADEMARK OFFICE
CERTIFICATE OF CORRECTION

| | | |
|---|---|---|
| PATENT NO. | : 7,149,105 B2 | Page 1 of 1 |
| APPLICATION NO. | : 10/785913 | |
| DATED | : December 12, 2006 | |
| INVENTOR(S) | : Brown et al. | |

It is certified that error appears in the above-identified patent and that said Letters Patent is hereby corrected as shown below:

Column (19), line (12): delete "(Go)" insert --(Co)--
Column (19), line (48); delete "(CoFcB-based)" insert --(CoFeB-based)--
Column (19), line (66); delete "(A1$_2$0$_3$)" insert --(Al$_2$O$_3$)--
Column (20), line (10); delete "(Go)" insert --(Co)--
Column (22), line (14), delete "(FtMn)' insert --(PtMn)--
Column (22), line (15); delete (Al$_{2O3}$)" insert --(Al$_2$O$_3$)--
Column (22), line (22); delete "(Ca)" insert --(Co)--
Column (22), line (26): delete "(Ca)" insert --(Co)--
Column (22), line (27); delete "(70-90)" insert --(70-90,)--

Signed and Sealed this

Sixth Day of March, 2007

JON W. DUDAS
*Director of the United States Patent and Trademark Office*

UNITED STATES PATENT AND TRADEMARK OFFICE
CERTIFICATE OF CORRECTION

PATENT NO. : 7,149,105 B2 Page 1 of 1
APPLICATION NO. : 10/785913
DATED : December 12, 2006
INVENTOR(S) : Brown et al.

It is certified that error appears in the above-identified patent and that said Letters Patent is hereby corrected as shown below:

Column 18, line 61; delete "baffler" insert --barrier--

Signed and Sealed this

Second Day of October, 2007

JON W. DUDAS
*Director of the United States Patent and Trademark Office*

UNITED STATES PATENT AND TRADEMARK OFFICE
CERTIFICATE OF CORRECTION

PATENT NO. : 7,149,105 B2 Page 1 of 1
APPLICATION NO. : 10/785913
DATED : December 12, 2006
INVENTOR(S) : Brown et al.

It is certified that error appears in the above-identified patent and that said Letters Patent is hereby corrected as shown below:

Column 18, line 61; delete "baffler" insert --barrier--

Signed and Sealed this

Sixteenth Day of October, 2007

JON W. DUDAS
*Director of the United States Patent and Trademark Office*